United States Patent
Garakani

(12) 
(10) Patent No.: US 7,298,298 B1
(45) Date of Patent: Nov. 20, 2007

(54) MULTI-EPOCH CODEBOOK LEARNING IN A LOSSY PACKET NETWORK

(75) Inventor: Mehryar Khalili Garakani, Westlake Village, CA (US)

(73) Assignee: Cisco Technology, Inc., San Jose, CA (US)

( * ) Notice: Subject to any disclaimer, the term of this patent is extended or adjusted under 35 U.S.C. 154(b) by 1022 days.

(21) Appl. No.: 10/414,918

(22) Filed: Apr. 15, 2003

(51) Int. Cl.
*H03M 7/30* (2006.01)

(52) U.S. Cl. .......................... 341/87; 341/50; 341/106; 341/76

(58) Field of Classification Search ................. 341/50, 341/51, 87, 76, 106
See application file for complete search history.

(56) References Cited

U.S. PATENT DOCUMENTS

| | | | |
|---|---|---|---|
| 5,598,154 A * | 1/1997 | Wilson et al. | 341/50 |
| 5,602,550 A * | 2/1997 | Stein | 341/76 |
| 5,617,552 A * | 4/1997 | Garber et al. | 711/1 |
| 5,884,269 A | 3/1999 | Cellier et al. | |
| 6,434,168 B1 | 8/2002 | Kari | |
| 2001/0046260 A1 | 11/2001 | Molloy | |
| 2002/0091905 A1 | 7/2002 | Geiger et al. | |

OTHER PUBLICATIONS

ITU (International Telecommunications Union) ITU-T (Telecommunication Standardization Sector of ITU) Recommendation V.42, Series V: Data Communication Over the Telephone Network, "Error-correcting procedures for DCEs using asynchronous-to-synchronous conversion" (Mar. 2002) (67 pages).

ITU (International Telecommunications Union) ITU-T (Telecommunication Standardization Sector of ITU) Recommendation V.44, Series V: Data Communication Over the Telephone Network, "Data compression procedures" (Nov. 2000) (59 pages).

\* cited by examiner

*Primary Examiner*—Jean Bruner Jeanglaude
(74) *Attorney, Agent, or Firm*—Marger Johnson & McCollom, P.C.

(57) ABSTRACT

A network device capable of transmitting data includes a processor, an encoder and a port. The encoder encodes the data using a known valid dictionary while constructing a new dictionary over an epoch of data. A network device capable of receiving encoded data is also disclosed. The network device includes a processor, a port and a decoder. The decoder is operable to decode the data using a known valid dictionary, while constructing a new dictionary over the epoch of data. When a valid dictionary has been constructed, the receiving device notifies the transmitting device.

34 Claims, 2 Drawing Sheets

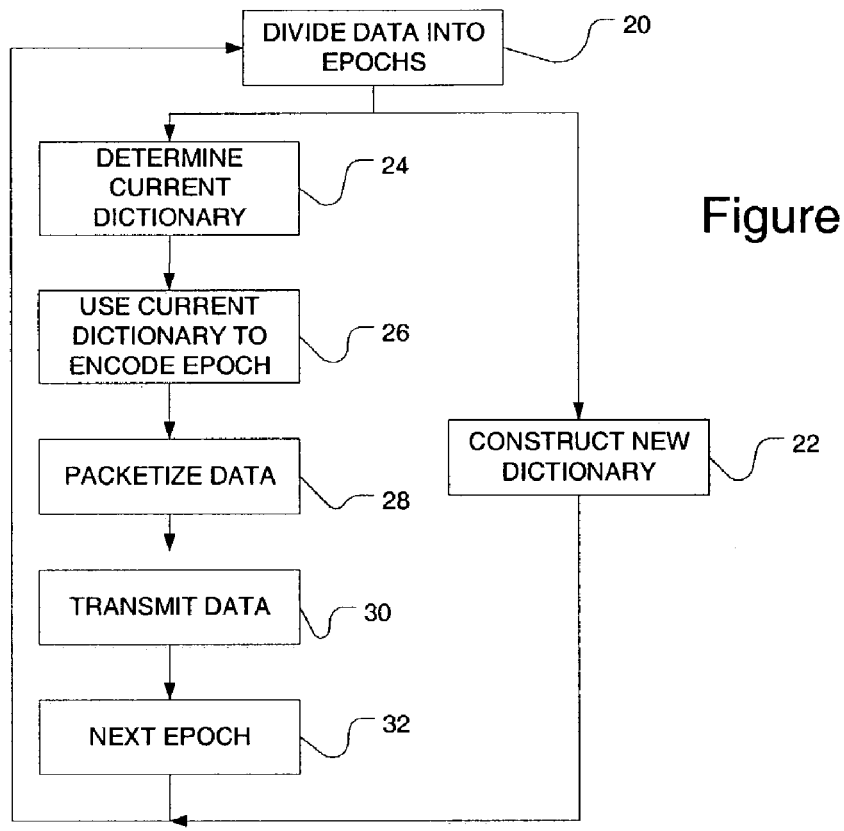
Figure 2
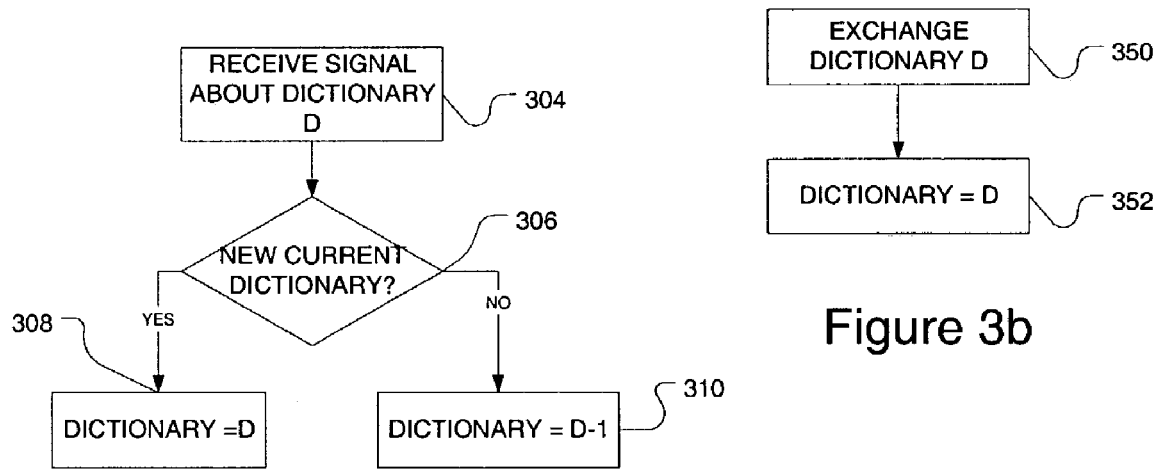
Figure 3a
Figure 3b

MULTI-EPOCH CODEBOOK LEARNING IN A LOSSY PACKET NETWORK

BACKGROUND

1. Field

This disclosure relates to compression or encoding techniques in lossy networks, more particularly to building codebooks in lossy networks.

2. Background

Encoding data to compress it has several advantages, especially for communication networks. The reduction in the size of data needing to be sent reduces the bandwidth required to send it. This in turn avoids congestion on the network and allows the bandwidth that would otherwise be used to transmit the uncompressed data to be used for other transmissions.

In lossless networks, codebook or dictionary encoding can be very powerful. Examples include Lempel-Ziv (LZ) or Huffmann coding. Dictionary methods provide effective mechanisms for generic compression of data streams over a reliable channel. A reliable channel ensures no loss of data between a transmitter and a receiver. This is required because the receiver must also use the same data stream used to construct the dictionary in the transmitter. For example, in modem communication Lempel-Ziv based algorithms such as ITU (International Telecommunications Union) Recommendation V.44 and V.42 are used over a reliable link layer. The reliable link ensures that the compressor or encoder and the decompressor or decoder remain in sync.

These types of techniques are very desirable for lossy packet networks as well as lossless networks. However there are problems that arise with lossy packet networks, when a reliable transport cannot be considered. Full reliability can be achieved through acknowledgement and retransmit schemes, but the resulting delays or latency in the network is unbounded, making this unsuitable for some applications requiring low latency. An example may be ClearChannel applications over Internet Protocol (IP) networks. Forward Error Correction may be considered, but actually only reduces the resulting packet loss, and does not guarantee a reliable link.

Current techniques that allow dictionary compression in lossy packet networks include a notification scheme and a per-packet scheme. In the notification scheme, the receiving entity, or receiver, notifies the transmitter that a packet has been lost. The two entities reset their dictionaries and go through a synchronization process. This has a problem with loss of data between the loss of the first packet and the re-synchronization, as packets that are received between those two events have to be discarded. Additionally, after the loss of the packet and the re-synchronization, during which the dictionaries are reset, both entities must build up their compression codebooks, resulting in an even longer period for which there is less than optimal compression.

In per-packet schemes, the encoder and decoder can build their dictionaries on a per packet basis. At the beginning of each packet, the dictionaries at either end are reset. This solves the problem of synchronizing the dictionaries. However, a single packet is typically too small an amount of data to allow sufficient dictionary training for good compression. In addition, rebuilding a dictionary every packet increases the operating overhead of the sending and receiving entities, which may prove unacceptable.

SUMMARY

One embodiment of the invention comprises a network device capable of transmitting data. The device includes a processor, an encoder and a port. The encoder encodes the data using a known valid dictionary while constructing a new dictionary over an epoch of data.

Another embodiment of the invention comprises a network device capable of receiving encoded data is also disclosed. The network device includes a processor, a port and a decoder. The decoder is operable to decode the data using a known valid dictionary, while constructing a new dictionary over the epoch of data. When a valid dictionary has been constructed, the receiving device notifies the transmitting device.

BRIEF DESCRIPTION OF THE DRAWINGS

Embodiments of the invention may be best understood by reading the disclosure with reference to the drawings, wherein:

FIG. 2 is a flowchart of an embodiment of a method of multi-epoch codebook learning in a lossy packet network.

FIGS. 3a and 3b are flowcharts of embodiments of methods of dictionary validation.

DETAILED DESCRIPTION OF THE EMBODIMENTS

Figure 1:
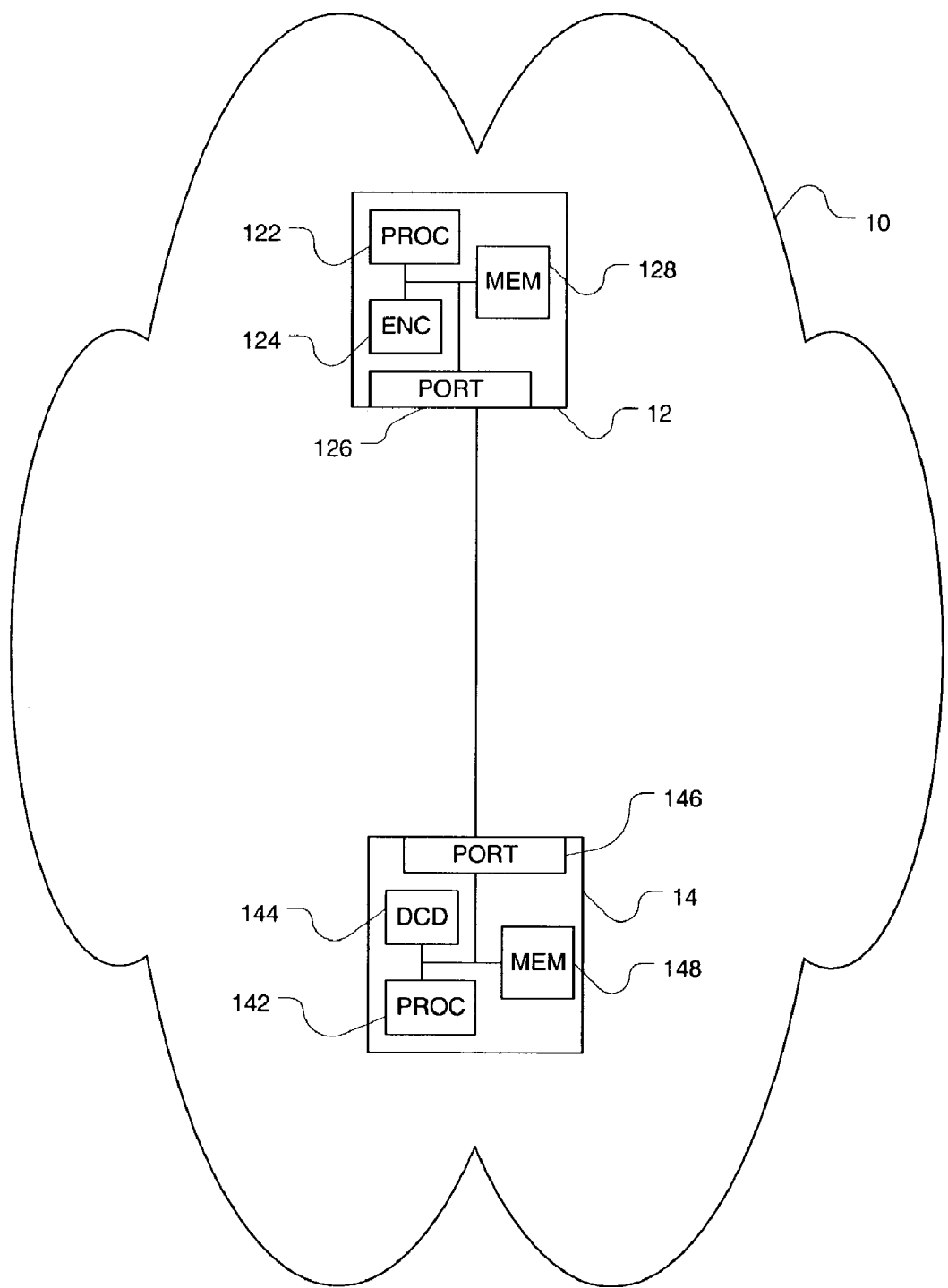
FIG. 1 is an embodiment of a network transmitting and receiving entities using dictionary encoding.

FIG. 1 shows an embodiment of a network having a transmitting entity 12 and a receiving entity 14. While these entities could function as transmitters, receivers or both, for purposes of discussion here, the transmitting entity will be referred to a transmitter and the receiving entity will be referred to as a receiver. This is not intended to imply that either of these network devices is limited to whichever capability their name refers.

The transmitter 12 comprises a processor 122, an encoder 124, a port 126 and possibly a memory 128. The encoder 124 may be part of the processor 122, shown by the box 120. Being a 'part' or component of the processor means that the processor performs the encoding function, whether a physical part of the processor is dedicated to encoding, or whether the encoding function is accomplished through instructions executed by the processor. The processor may be, but is not limited to, a general-purpose processor, a digital signal processor, an application specific integrated circuit, or a programmable device programmed to perform the necessary functions, such as a field programmable gate array (FPGA).

The encoder will 'encode' or compress the data, the terms encode and compress being used interchangeably here. This is generally done in accordance with a codebook. For example, a particular LZ compression algorithm takes each input sequence of bits of a given length and creates an entry in a table, also referred to here as a "dictionary" or "codebook" for that particular bit pattern, consisting of the pattern itself and a shorter code. As input is read, any pattern that has been read before results in the substitution of the shorter code, effectively compressing the total amount of input to something smaller.

The receiver 14 comprises a processor 142, a decoder 144, which may be part of the processor as shown by 140, a port 146 and a memory 148, which is optional. In either entity, the encoder 124 and the decoder 144 may actually perform both functions of encoding and decoding. These are typically called coder/decoders, or 'codecs.' The decoder decodes/decompresses the data and reconstruct the uncompressed data stream.

A possible problem with this, as discussed earlier, is that the two entities involved in the data transaction have to use the same codebook. In a lossless network, the receiver would be able to reconstruct the codebook used and then uncompress the data. In a lossy network, that does not work as well. Some means of ensuring synchronization between the two entities is needed that does not involve excessive acknowledgements and retransmissions, while allowing use of larger stretches of data than a mere packet.

A flowchart of an embodiment of a method of multi-epoch codebook learning in a lossy packet network is shown in FIG. 2. The process starts at 20 with the transmitter dividing the data stream into phases of data, called epochs. Each epoch represents a certain stretch of data octets to be sent by the transmitter. For example, each 8 kilobytes of data octets sent to the encoder represents a separate epoch. Epoch 1 would be octet 1 to octet 8K, epoch 2 would be octet 8K+1 to octet 16K, etc.

The encoder constructs a new or 'prospective' dictionary over a fixed portion of any given epoch at 22. For example, the dictionary may be constructed over the first 4 kilobytes of any epoch. This dictionary cannot be used, obviously, for the epoch over which it is constructed, but will be used for the next one. That is, a current epoch N would be encoded using a dictionary D−1, while a prospective dictionary D is being constructed. The transmitter and receiver would independently construct the dictionary D over epoch N, the transmitter while in the process of encoding epoch N, the receiver while in the process of decoding it. If a packet is lost during a particular epoch, the dictionaries are not constructed for that epoch. Actually, the dictionary may be constructed at the transmitting end, but not at the receiving end.

Therefore, the receiving end controls the definition of the current dictionary. For epoch N above, the dictionary D−1 was being used. The transmitter would know that the dictionary D−1 is valid because the receiver told the transmitter that it was valid. When the receiver is able to construct a dictionary D over epoch N that is valid, it notifies the transmitter that the dictionary D is valid. The transmitter then uses what was the prospective dictionary, dictionary D, as the current dictionary for the next epoch, N+1. The construction of the prospective dictionary is done in parallel with the processing of the current epoch for encoding and transmission.

In the initial epoch, there is no dictionary. Since the transmitter only compresses the data if there is a valid dictionary in existence, it may be desirable to have a first epoch of a smaller size to allow quicker engagement of the encoder. In choosing the actual size of the epochs, which is left up to the system designer, the designer should consider a size large enough to allow good dictionary learning to occur, but small enough for a given packet loss profile to result in a significant fraction of epochs providing good dictionaries. Epochs that are too small will not allow for efficient compression, as the codebook would be too small. Epochs that are too large run a higher possibility that a packet loss will occur in that epoch, preventing the construction of a valid dictionary.

Whether a dictionary exists, or which dictionary is current, is determined at 24. The receiver will typically dictate which dictionary is the current dictionary. If the receiver has been able to construct a valid dictionary over epoch N, for example, resulting in a valid dictionary D, the receiver may indicate that to the transmitter. Alternative embodiments for determining which is the current dictionary are shown in FIGS. 3a and 3b, discussed below.

The current dictionary, if it exists, is used to compress the data at 26. The data will then be packetized at 28. Packetization of the data will also allow the identifier for the dictionary to be included in the packet header. This allows the decoder to know with which dictionary the packet was encoded. In setting the size of the epoch, the system designer may opt for a fixed size of an epoch, with the transmission rate varying, or the designer may choose to vary the size and use a fixed rate. For example, all of the packets in an epoch may be 80 byte packets, but the rate at which they are transmitted may vary, as the time for a packet to be 'filled up' may vary. Alternatively, the designer may send a packet of whatever size every 10 milliseconds.

An offset value for the data in a particular packet may be packetized as well. The offset value identifies where, in the larger stream of data, the data in that packet fits. For example, the first packet may have an offset value of 0, while the second packet may have an offset value of 80, indicating that the first byte of the packet is byte 81 in the overall data stream that was packetized at the transmitting end.

It should be noted that each packet is decoded independently from any other packet, since the dictionary to be used to decode that packet is known by each side. This means that loss of a packet will not require resynchronization of codebooks. All a loss of a packet would mean is that the encoder would use an older dictionary until a newer one can be validated.

The data is transmitted at 30. The next epoch in the data stream then becomes the current epoch at 32 and the dual processes of encoding and transmitting the data and of creating a new dictionary begin for the new epoch. Alternative embodiments of determining which dictionary is the current dictionary at 24 are shown in FIGS. 3a and 3b.

In FIG. 3a, an embodiment of what is called an implicit determination of the current dictionary is shown in flowchart form. At 304, a signal is received from the receiver that the dictionary D constructed over epoch N at the receiver is either valid or invalid. It may be that the signal is either received indicating a valid dictionary, or that no signal is received, indicating that the no valid dictionary could be constructed over epoch N. At 306, the determination as to whether the signal, or lack thereof, indicates a valid dictionary D, is made. If the dictionary D is valid, the current dictionary is set to be dictionary D at 308. If there is an indication that D is invalid, either by a direct signal or by a lack of a signal from the receiver, the current dictionary remains dictionary D−1.

In FIG. 3b, an embodiment of what is referred to here as an explicit determination of the current dictionary is shown. At 350, the transmitter and receiver exchange dictionaries. It must be noted that the term 'exchange' as used here may include both entities transmitting their respective dictionaries to each other, or one entity transmitting its dictionary to the other for comparison. This exchange will typically be done out of band, so as to not interfere with the data transmission. The current dictionary is then defined to be the just-exchanged dictionary, in this case D, at 352. The process then returns to FIG. 2 at 32 and the next epoch is encoded.

In either case, the dictionary will be updated frequently, ensuring that the dictionaries reflect a close to current state of the data being compressed, allowing for more efficient compression. The dictionaries will be based upon data with similar properties to that being compressed. The dictionaries are constructed over large stretches of data, leading to better learning quality of the dictionary, resulting in better compression.

The implementation of the methods may be in hardware, in the form of a processor, ASIC, FPGA, etc., as noted above. Alternatively, it may be in the form of an article of machine-readable media upon which are instructions that, when executed, cause the machines to perform the methods of the invention. The machines would typically be the network devices of the transmitting and receiving entities, discussed above.

Implementing embodiments of the invention of a lossy packet network has several advantages. The codebook schemes do not suffer from synchronization problems due to packet loss. Decoding packets can be done on a per packet basis. Codebooks can be constructed over a large stretch of data resulting in good quality codebooks. Codebooks can be dynamically adjusted to recent characteristics of data streams.

Thus, although there has been described to this point a particular embodiment for a method and apparatus for multi-epoch codebook learning, it is not intended that such specific references be considered as limitations upon the scope of this invention except in-so-far as set forth in the following claims.

What is claimed is:

1. A network device, comprising:
    a processor to divide a data stream into epochs and to determine if a prospective dictionary is to become a current dictionary;
    an encoder to encode a selected epoch if a current dictionary exists and to construct a prospective dictionary over the epoch; and
    a port to allow the network device to transmit the epoch.

2. The network device of claim 1, wherein the encoder is part of the processor.

3. The network device of claim 1, wherein the port is also to allow reception of a signal from a receiver.

4. The network device of claim 1, wherein the port is also to allow an exchange of at least one prospective dictionary with a receiver.

5. A network device, comprising:
    a means for dividing a data stream into epochs and to determine if a prospective dictionary is to become a current dictionary;
    a means for encoding a selected epoch if a current dictionary exists and to construct a prospective dictionary over the epoch; and
    a means for allowing the network device to transmit the epoch.

6. The network device of claim 5, wherein the means for dividing further comprises a processing means.

7. The network device of claim 6, wherein the means for encoding is a component of the processing means.

8. A method of transmitting data, the method comprising:
    dividing a data stream into epochs;
    constructing a prospective dictionary over a selected epoch;
    encoding the selected epoch using a current dictionary;
    transmitting the epoch; and
    determining if the prospective dictionary is to become the current dictionary.

9. The method of claim 8 wherein dividing the data stream into epochs further comprises dividing the data stream into epochs of a predetermined size, wherein the predetermined sized is based in part upon a frequency of packet loss.

10. The method of claim 8 wherein transmitting the encoded epoch of data further comprises packetizing the encoded epoch of data such that each packet includes a dictionary identifier.

11. The method of claim 10 wherein packetizing the encoded epoch of data further comprises packetizing the data such that each packet includes an offset value.

12. The method of claim 8 wherein determining if the prospective dictionary is to become the current dictionary further comprises:
    receiving a signal from a receiver indicating that the prospective dictionary is valid; and
    defining the current dictionary to be the prospective dictionary.

13. The method of claim 8 wherein determining if the prospective dictionary is to become the current dictionary further comprises explicitly exchanging at least one prospective dictionary between transmitter and receiver.

14. An article of machine-readable media containing instructions that, when executed, cause the machine to:
    divide a data stream into epochs;
    construct a prospective dictionary over a selected epoch;
    encode the selected epoch using a current dictionary;
    transmit the epoch; and
    determine if the prospective dictionary is to become the current dictionary.

15. The article of claim 14, wherein the code that causes the machine to divide the data stream into epochs further causes the machine to divide the data stream into epochs of a predetermined size, wherein the predetermined sized is based in part upon a frequency of packet loss.

16. The article of claim 14, wherein the code that causes the machine to transmit the encoded epoch of data further causes the machine to packetized the encoded epoch of data such that each packet includes a dictionary identifier.

17. The article of claim 14, wherein the code that causes the machine to packetize the encoded epoch of data further causes the machine to packetize the data such that each packet includes an offset value.

18. The article of claim 14, wherein the code that causes the machine to determine if the prospective dictionary is to become the current dictionary further causes the machine to:
    receive a signal from a receiver indicating that the prospective dictionary is valid; and
    define the current dictionary to be the prospective dictionary.

19. A network device, comprising:
    a port to allow the network device to receive an epoch of encoded data;
    a decoder to decode the epoch if a current dictionary exists and to build a prospective dictionary over the epoch; and
    a processor to determine if the prospective dictionary is valid and to communicate with a transmitter through the port.

20. The network device of claim 19, wherein the decoder is a component of the processor.

21. The network device of claim 19, wherein the processor is further to communicate whether the prospective dictionary is valid to the transmitter.

22. The network device of claim 19, wherein the processor is further to exchange at least one prospective dictionary with the transmitter.

23. A network device, comprising:
    a means for allowing the network device to receive an epoch of encoded data;

a means for decoding the epoch if a current dictionary exists and to build a prospective dictionary over the epoch; and a means for determining if the prospective dictionary is valid and to communicate with a transmitter through the port.

24. The network device of claim 23, wherein the means for decoding is a component of the means for determining.

25. A method of receiving data, the method comprising:
receiving an epoch of encoded data;
decoding the epoch using a current dictionary;
building a prospective dictionary over the epoch; and
communicating with a transmitter, if the prospective dictionary is valid.

26. The method of claim 25 wherein decoding the epoch further comprising first depacketizing the epoch to extract a dictionary identifier to identify the current dictionary.

27. The method of claim 26 wherein depacketizing the epoch further comprises extracting an offset value.

28. The method of claim 25 wherein communicating with a transmitter further comprises sending a signal to the transmitter indicating that the prospective dictionary is valid, and causing the prospective dictionary to be defined as the current dictionary.

29. The method of claim 25 wherein communicating with a transmitter further comprises exchanging at least one prospective dictionary with the transmitter.

30. An article of machine-readable instructions that, when executed, cause the machine to:

receive an epoch of encoded data;

decode the epoch using a current dictionary;

build a prospective dictionary over the epoch; and communicate with a transmitter, if the prospective dictionary is valid.

31. The article of claim 30 wherein the code causing the machine to decode the epoch further causes the machine to depacketize the epoch to extract a dictionary identifier to identify the current dictionary.

32. The article of claim 30 wherein the code causing the machine to depacketize the epoch further causes the machine to extract an offset value.

33. The article of claim 30 wherein the code causing the machine to communicate with a transmitter further causes the machine to send a signal to the transmitter indicating that the prospective dictionary is valid, and cause the prospective dictionary to be defined as the current dictionary.

34. The article of claim 30 wherein the code causing the machine to communicate with a transmitter further causes the machine to exchange at least one prospective dictionary with the transmitter.

* * * * *